United States Patent [19]

Take et al.

[11] Patent Number: 4,734,678
[45] Date of Patent: Mar. 29, 1988

[54] HIGH-RESOLUTION A/D CONVERTER

[75] Inventors: Masafumi Take; Haruo Takeda, both of Tokyo, Japan

[73] Assignee: Seiko Instruments Inc., Tokyo, Japan

[21] Appl. No.: 22,045

[22] Filed: Mar. 5, 1987

[30] Foreign Application Priority Data

Mar. 5, 1986 [JP] Japan .................................. 61-48003

[51] Int. Cl.⁴ .............................................. H03M 1/10
[52] U.S. Cl. .............................. 340/347 CC; 364/571; 340/347 AD
[58] Field of Search ................. 340/347 AD, 347 CC; 364/571

[56] References Cited

U.S. PATENT DOCUMENTS

| 4,272,760 | 6/1981 | Prazak | 340/347 CC |
| 4,280,196 | 7/1981 | Hornak | 340/347 CC |
| 4,340,882 | 7/1982 | Maio | 340/347 CC |
| 4,535,857 | 8/1985 | Haze | 364/571 |
| 4,544,917 | 10/1985 | Lenhoff | 340/347 AD |

Primary Examiner—Charles D. Miller
Attorney, Agent, or Firm—Bruce L. Adams; Van C. Wilks

[57] ABSTRACT

In order to provide a high-resolution A/D converter, the present invention is based upon the combination of two D/A converters, an input switch, an adder, an amplifier and a processor, wherein characteristics of the two D/A converters are learned relying upon the work of the processor and the switch, and the final digital output is corrected relying upon the thus learned characteristics to accomplish a high resolution.

1 Claim, 2 Drawing Figures

HIGH-RESOLUTION A/D CONVERTER

BACKGROUND OF THE INVENTION

The present invention relates to an analog-to-digital converter.

The invention of this type has heretofore been proposed comprising, as shown in FIG. 2, an adder or a subtractor 3 which adds or substracts an input signal from an analog signal input terminal 1 and an analog output from a D/A converter 7, an amplifier 4 for amplifying the analog output of said adder or said subtractor 3, an A/D converter 5 which converts the analog output of said amplifier 4 into a digital value, and a processor 6 which reads the digital output of said A/D converter 5 and which determines a digital output for said D/A 7 converter.

According to the above-mentioned prior art as is widely known, there is no guarantee that a bit width of the D/A converter at a minimum resolution is maintained perfectly uniform. Namely, any variance in the bits from the D/A converter is amplified through the amplifier, and the continuity of data is lost in the final output of the A/D converter.

SUMMARY OF THE INVENTION

It is an object of the invention to provide a high-resolution A/D converter.

Other and further objects, features and advantages of the invention will become apparent from the following description.

The present invention was developed in order to accomplish the above-mentioned object, and is chiefly comprised of a first D/A converter, a switch for selecting an analog output signal from said first D/A converter and an analog signal from an analog signal input terminal, a second D/A converter, a subtractor which performs the addition or subtraction of an analog signal that has passed through said switch and an analog output signal from said second D/A converter, an amplifier for amplifying the analog output signal of said subtractor, an A/D converter for converting the analog output signal of said amplifier into a digital signal, and a processor which reads the digital output signal of said A/D converter and provides digital input signals to said first and second D/A converters.

In the above-mentioned structure, the processor, first, selects the first D/A converter as an input through the switch, and alternatingly and successively changes the output values to the first and second D/A converters. The processor further reads the digital outputs from the A/D converter to store minimum bit widths of the first and second D/A converters. Based upon the thus stored values, the processor corrects the output from the second D/A converter when the analog signal from the analog signal input terminal is selected as an input through the switch, and combines it with the digital signal output from the above A/D converter to form a digital signal in order to accomplish a high degree of resolution.

DETAILED DESCRIPTION OF THE PREFERRED EMBODIMENT

Figure 1:
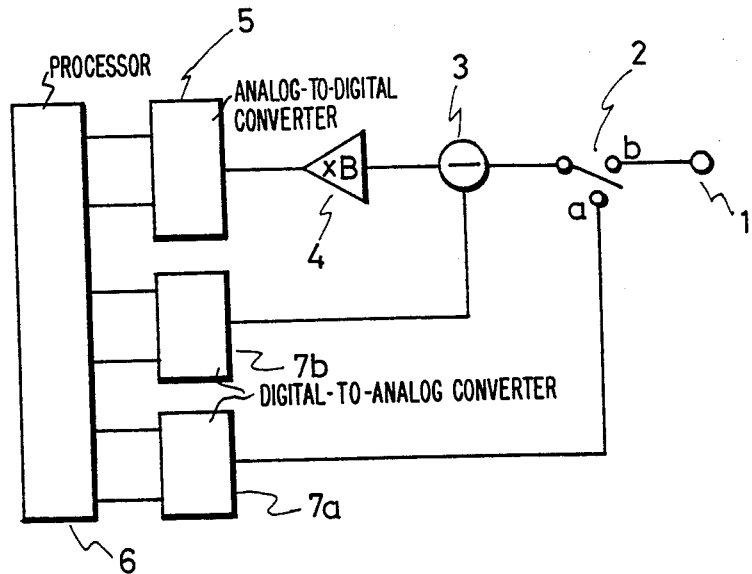
FIG. 1 is a circuit diagram illustrating an embodiment of the present invention.
Figure 2:
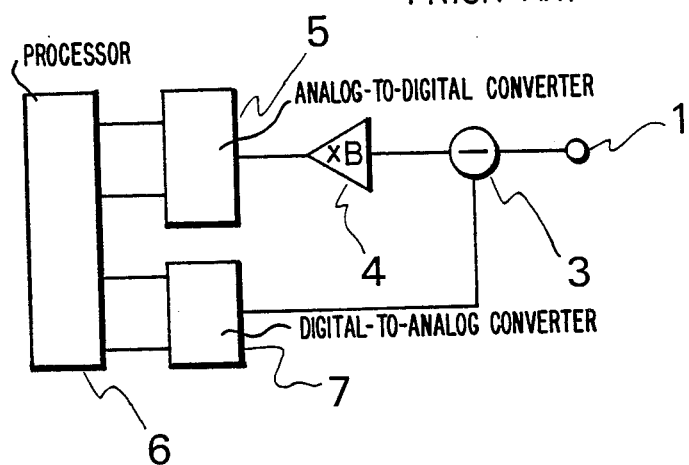
FIG. 2 is a circuit diagram illustrating the prior art.

The invention will now be described in detail with reference to an embodiment shown in FIG. 1, wherein reference numeral 7a denotes a first D/A converter, 7b denotes a second D/A converter, and 1 denotes an analog signal input terminal. Reference numerals 2 denotes a switch for selecting an analog signal from the analog signal input terminal 1 or an analog output signal from the first D/A converter 7a, and reference numeral 3 denotes a subtractor for subtracting the analog signal selected by the switch 2 and the analog output signal of the second D/A converter 7b. Reference numeral 4 denotes an amplifier for amplifying the analog output signal of the subtractor 3, 5 denotes an A/D converter for converting the analog output signal of the amplifier 4 into a digital signal, and 6 denotes a processor which reads the digital signal input from the A/D converter, and sends digital signals to the first D/A converter 7a and to the second D/A converter 7b.

First, the analog output signal of the first D/A converter 7a is selected by the switch 2 and is sent to the subtractor 3 which produces an analog signal that is obtained by subtracting an analog input signal of the second D/A converter 7b from the analog signal of the first D/A converter 7a. The analog output signal of the subtractor 3 is amplified by B times through the amplifier 4, input to the A/D converter 5, converted into a digital signal, and is read by the processor 6. Digital signal outputs from the processor 6 are fed to the first D/A converter 7a and to the second D/A converter 7b and the digital signal outputs are alternatingly and successively changed from 0 to a maximum value m as tabulated below, and digital output values from the A/D converter 6 that are read are denoted by $A_0$ to $A_{2m}$. From the relationships of this table, the bit widths $d_n^1$ and $d_n^2$ of the first D/A converter 7a and the second D/A converter 7b are given by the following equations.

TABLE

| | | | | | | | | | | | | | | |
|---|---|---|---|---|---|---|---|---|---|---|---|---|---|---|
| Digital output to the first D/A converter 7a | 0 | 1 | 1 | 2 | 2 | 3 | 3 ... | n − 1 | n | n | n + 1 ... | m − 1 | m | m |
| Digital output Z to the second D/A converter 7b | 0 | 0 | 1 | 1 | 2 | 2 | 3 ... | n − 1 | n − 1 | n | n ... | m − 1 | m − 1 | m |
| Digital input Y from the A/D converter 5 | $A_0$ | $A_1$ | $A_2$ | $A_3$ | $A_4$ | $A_5$ | $A_6$ ... | $A_{2n-2}$ | $A_{2n-1}$ | $A_{2n}$ | $A_{2n+1}$ ... | $A_{2m-2}$ | $A_{2m-1}$ | $A_{2m}$ |

$$d_n^1 = A_{2n-1} - A_{2n-2} (n=1, 2 \ldots, m) \tag{1}$$

$$d_n^2 = A_{2n} - A_{2n-1} (n=1, 2 \ldots, m) \tag{2}$$

The bit widths are found from $d_1^1$ to $d_m^1$ and from $d_1^2$ to $d_m^2$ in compliance with the above equations (1) and (2) and are stored, whereby the bit widths of the first D/A converter 7a and of the second D/A converter 7b are learned, and the accuracy for reading the bit widths becomes equal to that of the A/D converter 5.

Next, an analog input signal applied to the analog signal input terminal 1 is selected by the switch 2 and is input to the subtractor 3 which produces an analog signal obtained by substracting the analog input signal of the second D/A converter 7b from the analog input signal of the analog signal input terminal 1. The analog output signal of the subtractor 3 is amplified by B times by the amplifier 4, input to the A/D converter 5, converted into a digital signal, and is read by the processor 6 which applies an offset to the analog signal that is input through the analog signal input terminal 1, so that the analog signal of the second D/A converter 7b amplified by B times through the amplifier 4 will lie within an input range of the A/D converter 5. The analog signal input to the analog signal input terminal 1 is converted by the processor 6 into a digital signal in accordance with the following equation, $$X = \sum_{n=1}^{z} (A_{2n} - A_{2n-1}) + y \quad (3)$$

where
X: output signal obtained by digitizing an analog input signal,
y: output signal of the A/D converter 5,
Z: input signal to the second D/A converter 7b.

As described already, the reading accuracy of ($A_{2n} - A_{2n-1}$) on the right side of the equation (3) is equal to the output (y) of the A/D converter 6. Therefore, the accuracy of output signal X is nearly the same as the output (y) of the A/D converter 6. By using an i-bit A/D converter and an amplifier of B times as described above, there is realized an A/D converter having a high resolution of up to i+(bit conversion value of B). According to experiments conducted by the inventors, there is obtained a high-resolution A/D converter having more than 20 bits when i=16 and B=64.

(Effects of the Invention)

According to the present invention which learns and corrects the characteristics of the D/A converters, difference of the individual D/A converters and change by the aging can be neglected, and a high degree of resolution can be achieved without impairing the continuity.

What is claimed is:

1. A high-resolution A/D converter which comprises:
    a first D/A converter;
    a switch for selecting an output signal of said first D/A converter and an analog input signal;
    a second D/A converter;
    an adder which performs the addition or subtraction of a signal that has passed through said switch and an output signal of said second D/A converter;
    an amplifier for amplifying the output signal of said adder;
    an A/D converter for converting the output signal of said amplifier into a digital value; and
    a processor which reads the output of said A/D converter and give input values to said first and second D/A converters;
    wherein said processor stores all minimum bit widths of said first and second D/A converters, when said first D/A converter is selected as an input by said switch, and corrects the digital output value when the analog signal is selected as an input by said switch.

* * * * *